US006469941B2

(12) United States Patent
Ricodeau (10) Patent No.: US 6,469,941 B2
(45) Date of Patent: Oct. 22, 2002

(54) APPARATUS AND METHOD FOR PUMPING MEMORY CELLS IN A MEMORY

(75) Inventor: Francois Pierre Ricodeau, Coppell, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/751,367

(22) Filed: Dec. 29, 2000

(65) Prior Publication Data

US 2002/0085408 A1 Jul. 4, 2002

(51) Int. Cl.$^7$ .......................... G11C 16/04; G11C 11/24
(52) U.S. Cl. ................... 365/189.09; 365/149
(58) Field of Search ............ 365/189.09, 149, 365/189.06, 207, 226

(56) References Cited

U.S. PATENT DOCUMENTS

| | | | | |
|---|---|---|---|---|
| 4,769,784 A | * | 9/1988 | Doluca et al. ............. 365/149 |
| 5,255,232 A | * | 10/1993 | Foss et al. ................. 365/203 |
| 5,414,656 A | | 5/1995 | Kenney ...................... 365/149 |
| 5,508,962 A | * | 4/1996 | McLaughlin et al. .. 365/189.09 |
| 5,734,603 A | * | 3/1998 | Tai ............................. 365/149 |
| 6,081,459 A | * | 6/2000 | Kim ....................... 365/189.09 |
| 6,236,598 B1 | * | 5/2001 | Chou ..................... 365/189.06 |

OTHER PUBLICATIONS

Asakura et al., "Cell–Plate Line Connecting Complementary Bit–Line (C3) Architecture for Batter–Operating DRAM'S", IEEE Journal of Solid–State Circuits, Apr. 1992, pp. 597–602, V. 27, No. 4.

Fujishima et al., "A Storage–Node–Boosted RAM with Word–Line Delay Compensation", IEEE Journal of Solid–State Circuits, Oct. 1982, pp. 872–876, V. SC–17, No. 5.

* cited by examiner

Primary Examiner—Vu A. Le
Assistant Examiner—Anh Phung
(74) Attorney, Agent, or Firm—Lisa K. Jorgenson (57) ABSTRACT

An apparatus (and method) is provided that pumps (up or down) the voltage on a memory cell thereby increasing (above the logic one voltage value) or decreasing (below the logic zero voltage value) the voltage stored in the memory cell, and providing an increased differential on the bit lines during a subsequent read operation of the memory cell. When a logic one or zero voltage is coupled to the first plate of the memory cell for storage, the second plate is held at a voltage that is lower or higher, respectively (preferably a voltage that is the complement logic value of the value being stored). After the word line is deactivated (thereby decoupling the memory cell from the bit line and storing a logic one voltage value or logic zero voltage value), the voltage on the second plate is correspondently either raised or lowered. In the present invention, the second plate is raised or lowered to the precharge and equilibrate value (usually Vdd/2). This pumps the voltage stored in the memory cell to a higher voltage (if a logic one is stored) or a lower voltage (if a logic zero is stored).

24 Claims, 6 Drawing Sheets

FIG. 6

APPARATUS AND METHOD FOR PUMPING MEMORY CELLS IN A MEMORY

TECHNICAL FIELD

The present invention relates to memory and, in particular, to an apparatus and method for pumping memory cells in a memory.

BACKGROUND

In dynamic random access memories (DRAM), densities are increasing and operating voltages are decreasing. In addition, DRAMs are now being embedded with other logic and functionality on a single integrated circuit (IC). The technological drive toward higher densities, lower operating voltages and embeddedness for DRAMs are all contributing to a decreasing differential signal voltage (related to noise margin) detected on the bit lines during the read operation of a memory cell.

Accordingly, there exists a need for a method and apparatus for increasing the differential signal voltage detected during a read operation on the bit lines of a memory without the need for additional complex circuitry.

SUMMARY OF THE INVENTION

According to the present invention, there is provided a memory having a first bit line and a charge-storing element having a first plate and a second plate, with an access device having a first end coupled to the first bit line, a second end coupled to the first plate of the charge-storing element thereby defining a node, and a control terminal coupled to a word line. A voltage driver circuit coupled to the second plate of the charge-storing element provides, a high logic level voltage to the second plate of the charge-storing element when a low logic level is present on a second bit line, a low logic level voltage to the second plate of the charge-storing element when a high logic level voltage is present on the second bit line, and substantially the same voltage as an intermediate voltage to the second plate of the charge-storing element when the intermediate voltage level is present on the second bit line. The second bit line may be the same as the first bit line (true) or a complement bit line.

In another embodiment of the present invention, there is provided a memory having a first bit line, a charge-storing element having a first plate and a second plate, and an access device having a first end, a second end and a control terminal, the first end coupled to the first bit line, the second end coupled to the first plate of the charge-storing element and defining a node, the control terminal coupled to a word line, with the access device for coupling and decoupling the node from the first bit line. A voltage driver circuit coupled to the second plate of the charge-storing element applies a first voltage to the second plate of the charge-storing element when the access device is activated and a second voltage is applied to the node, and applies a third voltage to the second plate after the access device is deactivated.

In yet another embodiment of the present invention, there is provided a method of pumping a memory. A word line is activated for coupling a first plate of a memory cell to a first bit line. A sense amplifier coupled to the first bit line and a second bit line is activated for detecting a voltage differential between the first bit line and the second bit line. A high logic voltage value is applied to the first bit line and a low logic voltage value is applied to the second bit line. A first voltage is applied to a second plate of the memory cell. The word line is deactivated for decoupling the first plate of the memory cell from the first bit line. After the word line is deactivated, a second voltage greater than the first voltage is applied to the second plate of the memory.

In still another embodiment of the present invention, there is provided a method of pumping a memory. A first bit line and a second bit line are precharged and equilibrated to an intermediate voltage, the intermediate voltage having a magnitude between a first voltage and a second voltage representing a logic high and a logic low, respectively. A word line is activated for coupling a first plate of a memory cell to a first bit line. A sense amplifier coupled to the first bit line and a second bit line is activated. The first voltage is applied to the first bit line and the second voltage is applied to the second bit line. The second voltage is applied to a second plate of the memory cell. The word line is deactivated for decoupling the first plate of the memory cell from the first bit line. After the word line is deactivated, a third voltage is applied to the second plate of the memory wherein the third voltage is substantially equal to the intermediate voltage.

BRIEF DESCRIPTION OF THE DRAWINGS

For a more complete understanding of the present invention, and the advantages thereof, reference is made to the following description taken in conjunction with the accompanying drawings wherein.

DETAILED DESCRIPTION OF THE INVENTION

With reference to the drawings, like reference characters designate like or similar elements throughout the drawings.

Figure 1:
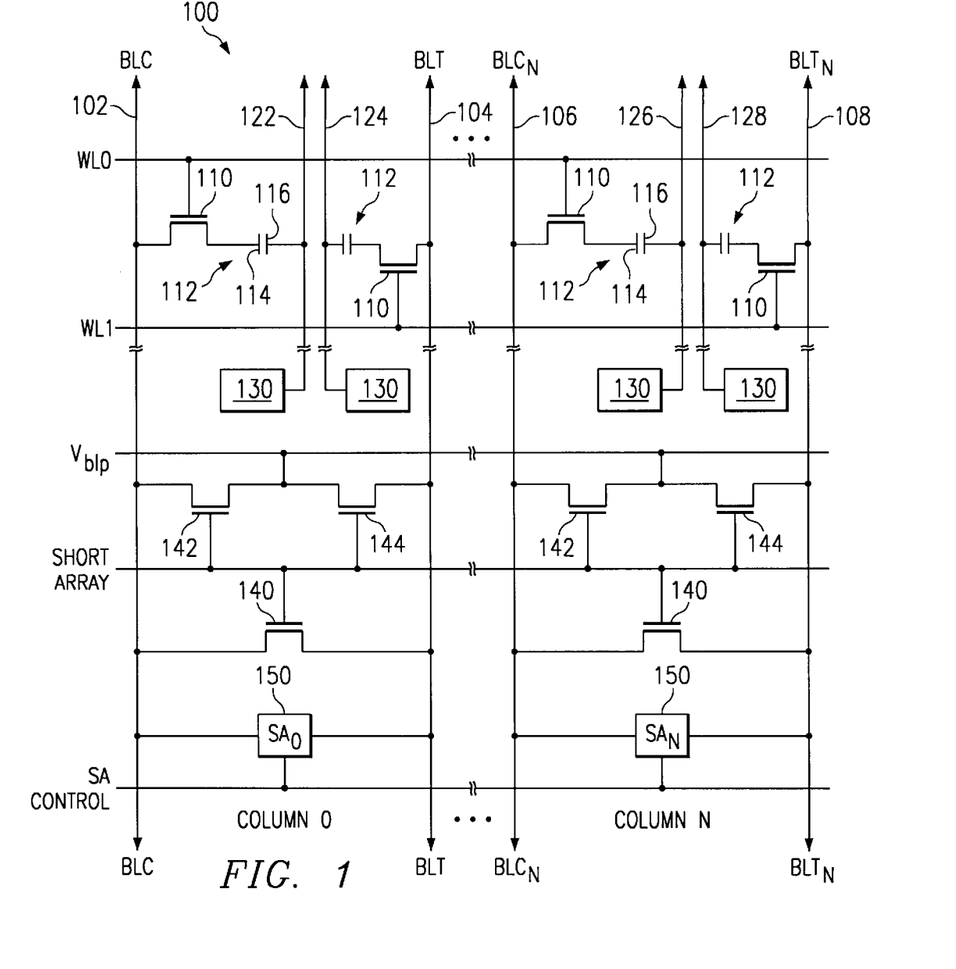
FIG. 1 is detailed diagram illustrating a memory array according to the present invention.

Now referring to FIG. 1, there is shown a detailed diagram illustrating a memory array 100 in accordance with the present invention. The memory array 100 includes a plurality of memory cells arranged in rows and columns, with each row corresponding to a word line (0 thru N) and each column (0 thru N) corresponding to two bit lines (a bit line true (BLT) and a bit line complement (BLC)). Column 0 actually includes two sets of memory cells, with one set of memory cells associated with BLC 102 and one set of memory cells associated with BLT 104. And column N includes two sets of memory cells, with one set of memory cells associated with BLCN 106 and one set with BLTN 108. With each memory cell is associated an access device or transistor 110 for coupling the memory cell to the respective bit line (BLC or BLT). Each memory cell comprises a capacitor or charge-storing device 112 (or element) having a first plate 114 and a second plate 116, with a node coupling the first plate 114 to a S/D region of the access transistor 110. The access transistors 110 are controlled by the respective word lines (WL0, WL1, etc.).

In each column, the second plate of the capacitors (of the memory cell) is coupled to a respective cell plate line. In FIG. 1, the set of memory cells associated with BLC 102 have their second plates 116 coupled to a cell plate line 122, while the set of memory cells associated with BLT 104 have their second plates 116 coupled to a cell plate line 124. Similarly, the set of memory cells associated with BLCN 106 have their second plates 116 coupled to a cell plate line 126, while the set of memory cells associated with BLTN 108 have their second plates 116 coupled to a cell plate line 128.

Also in FIG. 1 is shown bit line equilibrate and precharge circuitry (transistors 140, 142 and 140) coupled to a voltage reference source Vblp for precharging the bit lines to a reference voltage. A control signal, identified as SHORT ARRAY, provides the control mechanism for equilibrating and precharging the bit lines to the voltage Vblp. Also shown for each column 0 thru N are sense amplifiers 150 controlled by a signal SA.

For each set of memory cells associated with a respective bit line, a voltage driver circuit 130 provides a voltage source for each cell plate line connected to a set of memory cells (two sets of memory cells in each column with one set each associated with BLC and BLT; and a cell plate line for each set). As will be described further, and in accordance with the figures herein, the voltage driver circuit 130 provides a high logic level voltage (approximately Vdd) to the second plate 116 of the capacitor element 112 when a low logic level voltage (approximately Vss or ground) is present on the bit line (BLT or BLC), and a low logic level voltage to the second plate 116 of the capacitor element 112 when a high logic level voltage is present on the bit line (BLC or BLT). Further, the voltage driver circuit 130 provides substantially the same voltage as an intermediate voltage (approximately Vblp or Vdd/2) to the second plate 116 of the capacitor element 112 when the intermediate voltage level is present on the bit line (BLT or BLC).

Figure 2A:
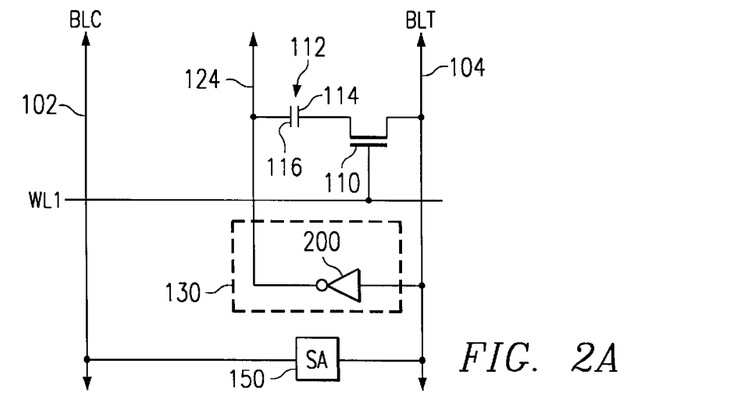
FIGS. 2A, 2B and 2C illustrate embodiments of the voltage driver circuit 130 shown in FIG. 1.
Figure 2B:
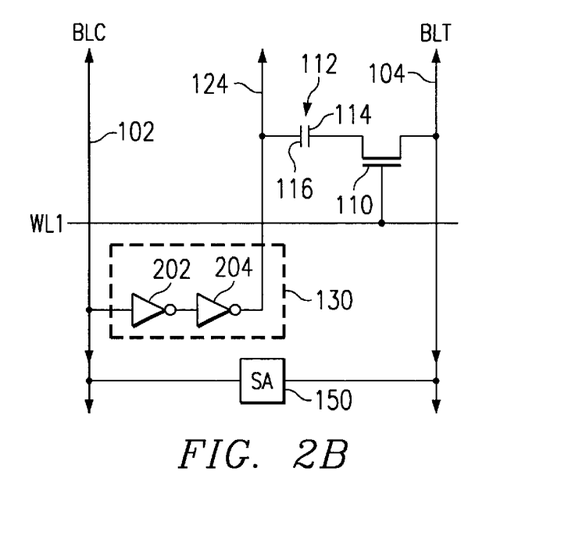
Figure 2C:
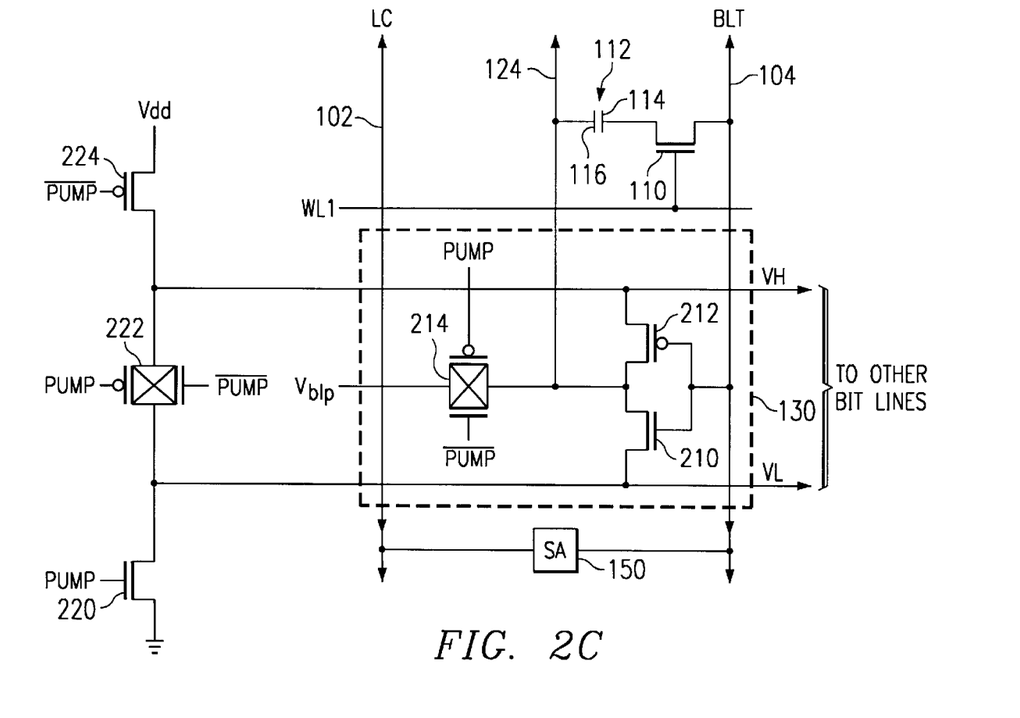

Now referring to FIGS. 2A, 2B and 2C, there are shown several embodiments of the voltage driver circuit 130 in accordance with the present invention. FIG. 2A describes one embodiment where the voltage driver circuit 130 couples the bit line BLT 104 to the cell plate line 124 of the associated memory cell. The voltage driver circuit 130 includes at least one inverter 200 with a predetermined delay. As will be appreciated, the inverter 200 may constructed using one n-channel transistor and one p-channel transistor (not shown), and additional inverters may be utilized. It will be understood that in this embodiment, the other columns of memory cells will be configured in a similar fashion.

FIG. 2B describes one embodiment where the voltage driver circuit 130 couples the complement bit line BLC 104 to the cell plate line 124 of the associated memory cell. The voltage driver circuit 130 includes a buffer circuit with a predetermined delay, and preferably includes two inverters 202 and 204. As will be appreciated, the inverters 202, 204 may constructed using one n-channel transistor and one p-channel transistor (not shown), and additional inverters may be utilized. It will be understood that in this embodiment, the other columns of memory cells will be configured in a similar fashion.

FIG. 2C preferably describes another embodiment where the voltage driver circuit 130 couples the bit line BLT 104 to the cell plate line 124 of the associated memory cell. This embodiment is similar to the embodiment shown in FIG. 2A with additional circuitry which helps reduce power dissipation. The voltage driver circuit 130 includes an n-channel transistor 210 and a p-channel transistor 212 configured as an inverter, with the input connected to BLT104 and the output connected to the cell plate line 124. A S/D of transistor 210 is connected to a line VL and a S/D of transistor 212 is connected to a line VH. As will be appreciated, the line VH and VL provide a mechanism to turn-off operation of the inverter (210, 212). When the voltage on VH and VL are approximately equal, no current flows through transistors 210, 212 and the inverter is inoperative.

The voltage levels on the lines VH and VL are set by operation of an n-channel transistor 220, a transmission gate 222, and a p-channel transistor 224, as shown. A signal PUMP provides a control signal for determining the voltage on the lines VH and VL, and further provides control of another transmission gate 214 (part of reference circuit 130) coupling/decoupling the reference voltage Vblp to the cell plate line 124. In operation, when the PUMP signal is active, VH is high and VL is low, thereby providing power to the inverter (210, 212) and decoupling Vblp from the cell plate line 124. This results in the inverse logic level voltage of the logic voltage level present on BLT 104 to be coupled to the cell plate line 124 (BLT=high, cell plate line 124=low, and vice versa). When the PUMP signal is inactive, the transistors 220, 224 are turned off and the lines VH and VL are shorted together resulting in a voltage of approximately Vdd/2 on lines VH and VL essentially turning off the inverter (210, 212). In addition, the transmission gate 214 couples Vblp to the cell plate line 124.

As will be appreciated, the complement bit line BLC 102 may be utilized instead of the true bit line BLT 104 with the addition of another inverter (210,212). Also, the transmission gates 214, 222 may alternatively be single transistor gates (controlled by PUMP or the PUMP complement).

It will be understood that the PUMP signal can be generated using a delayed version of the sense amplifier enable signal SA or generated from other clocking signals present in the memory array. Preferably, the PUMP signal is activated after the signal SA is activated and deactivated after the word line is deactivated. Alternatively, the PUMP signal may be deactivated after the SHORT ARRAY signal is activated (high), but this may cause additional power dissipation. One embodiment utilizes a delayed version of the signal SA. An alternative embodiment (not shown) utilizes the activation of the SHORT ARRAY signal to trigger the deactivation of the PUMP signal, or the deactivation/activation of some other timing signal to deactivate the PUMP signal at a time that is closely proximate the activation of the SHORT ARRAY signal. This provides the result that the voltage on the cell plate line 124 (i.e., the second plate 116 of the capacitor element 112) is substantially the same voltage (at substantially the same time) as an intermediate voltage (Vblp or Vdd/2) when the intermediate voltage level is present on the bit line BLT.

It will be understood that an additional voltage driver circuit 130 with the same operation and description, as shown in FIG. 2C, is utilized for the complement bit line BLC 102 (and its set of memory cells), as well as any additional bit lines.

The general operation of the present invention is as follows: The bit line is equilibrated and pre-charged to an intermediate voltage. The word line is activated producing a small voltage differential across the true bit line and complement bit line (depending on the value stored in the active memory cell). The sense amplifier is enabled detecting the differential and generating a high logic voltage and on the true bit line and a low logic voltage on the complement bit line, or vice versa, depending on the value stored in the active memory cell (read/refresh operation). As will be appreciated, the voltage values generated on the two bit lines will also depend on the logic value if the memory cell is being overwritten (write operation). Regardless of the logic voltage level (high or low) applied to the bit line of the active memory cell (being read/written), the complement logic voltage level (or substantially complement level) is applied to the cell plate line connected to the active memory cell. The word line is then deactivated storing the voltage present on the bit line to the capacitor (or charge-storing device) of the memory cell. After the word line is deactivated, an intermediate voltage is applied to the cell plate line connected to the previously active memory cell. Application of the intermediate voltage provides a "pumping" effect to the voltage stored on the memory cell, thereby raising/lowering the voltage of the stored value to a higher/lower voltage level (storing high/low). Operation of the present invention results in an increased bit line voltage differential during the subsequent read of the memory cell.

As will be appreciated, the intermediate voltage is a predetermined voltage level in the range between the logic high voltage level and the logic low voltage level. Preferably, the intermediate voltage is substantially equal to Vblp (or Vdd/2).

Figure 3:
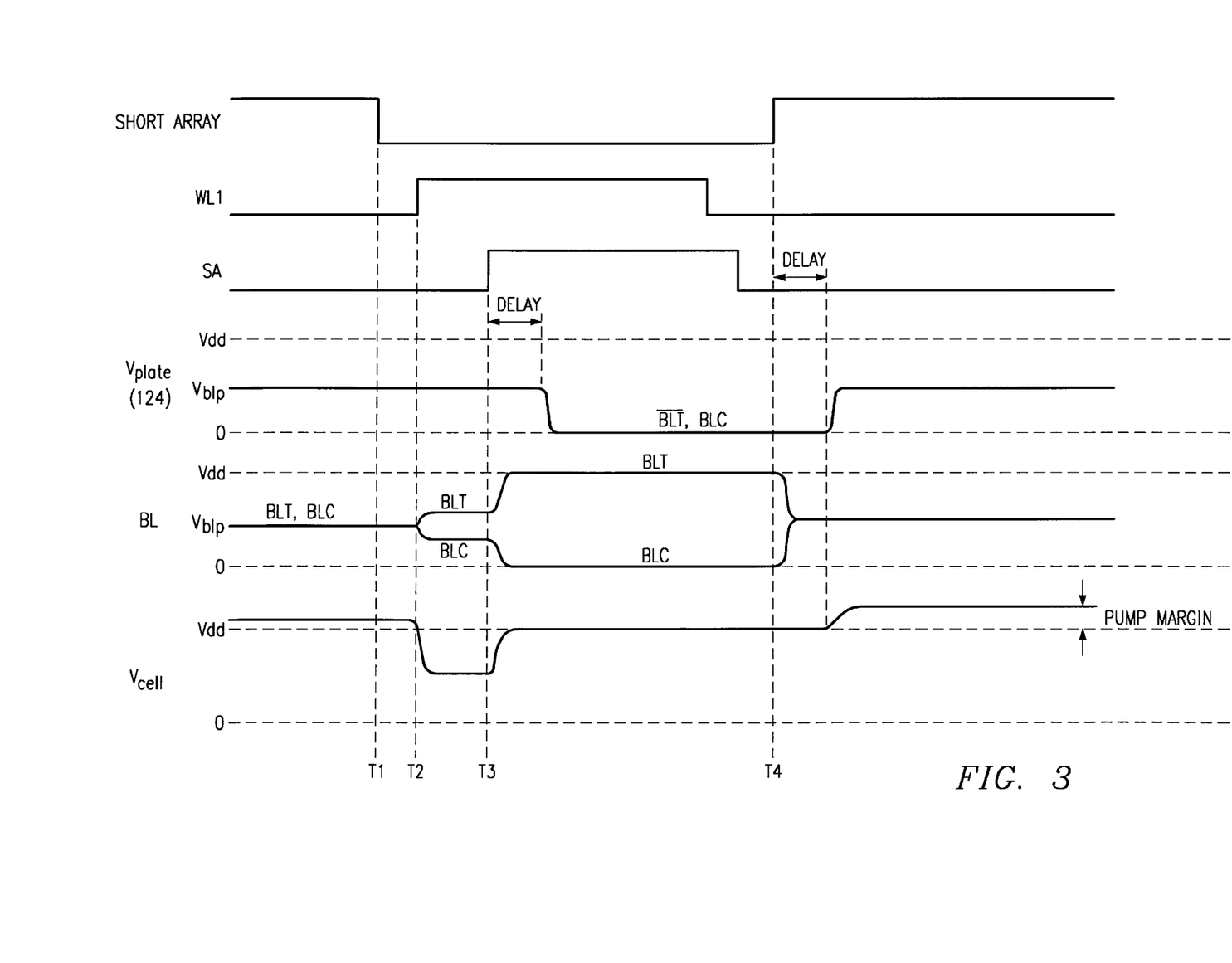
FIG. 3 is a timing diagram illustrating a read operation for a logic one stored in the memory cell for the embodiments shown in FIGS. 2A and 2B.
Figure 4:
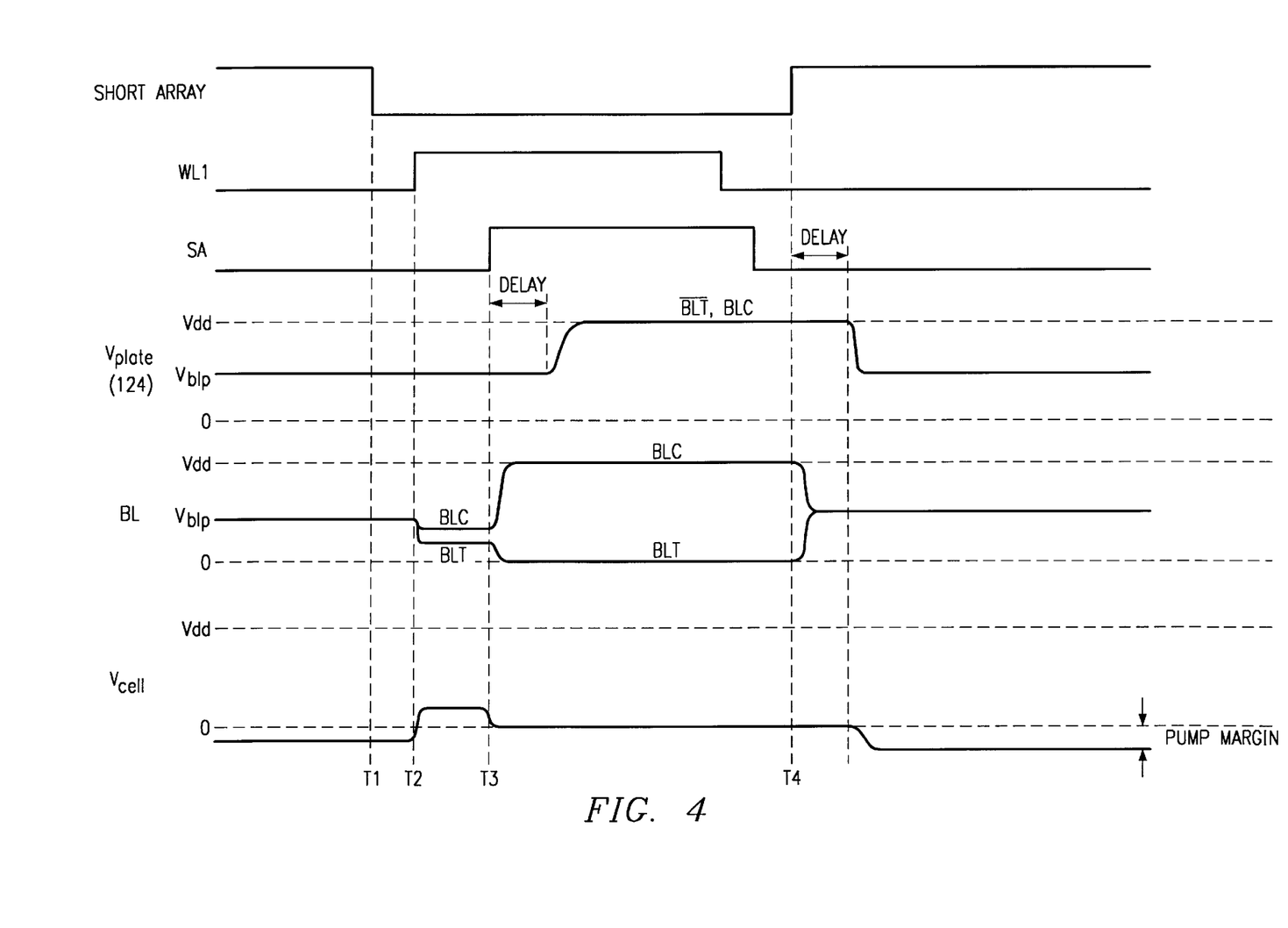
FIG. 4 is a timing diagram illustrating a read operation for a logic zero stored in the memory cell for the embodiments shown in FIGS. 2A and 2B.

Now referring to FIGS. 3 and 4 (and with reference to FIGS. 2A and 2B), there are shown detailed timing diagrams illustrating a read operation for a logic one and a logic zero, respectively, stored in the memory cell for the embodiments shown in FIGS. 2A and 2B.

The read operation (reading a logic one stored in the memory cell) shown in FIG. 3 generally begins at a time T1 when the SHORT ARRAY signal is deactivated (low) resulting in the precharge and equilibration of the bit lines (BLT, BLC) to a voltage Vblp (intermediate voltage). As will be appreciated, the Vblp voltage is also applied to the cell plate line 124 of the active memory cell (shown as Vplate). At a time T2, the word line WL1 is activated turning on the access transistor 110 and coupling the capacitor (or charge-storing device) 112 to the bit line BLT 104. A dummy cell (not shown) is also activated coupling a voltage reference Vref (not shown, and preferably about Vdd/3) to the bit line BLC 102. A differential voltage is generated on the bit lines BLC 102 and BLT 104. At a time T3, the SA signal is activated. The activated sense amplifier 150 amplifies the differential voltage present on the bit lines BLC 102 and BLT 104 generating a logic high voltage on the BLT 104 and a logic low voltage on the BLC 102. Because the reference voltage circuits 130 in the embodiments shown in FIGS. 2A and 2B couple the bit line BLT 104 (inverted) or the bit line BLC 102, respectively, to the cell plate line 124 (Vplate), the voltage applied to the cell plate line 124 (Vplate) is a logic low voltage.

As will be appreciated, a predetermined delay associated with the voltage driver circuits 130 is generated, as shown in FIG. 3. Preferably, the predetermined delay is sufficient to allow the sense amplifier 150 to sense the bit lines and generate a logic high and logic low on the bit lines before the cell plate line 124 goes low (i.e., before the voltage driver circuit 130 activates). This should help reduce any potential noise during sense that may be caused by the switching of voltage driver circuit 130.

After the word line WL1 is deactivated, and generally after the read operation is completed (or substantially completed), at a time T4, the SHORT ARRAY signal is activated (high) for the next read/write operation, which precharges and equilibrates the bit lines BLC 102 and BLT 104 to voltage Vblp. The voltage driver circuit 130 receives this input voltage and applies the voltage Vblp (intermediate voltage) to the cell plate line 124 (after the predetermined delay). As will be appreciated, increasing the voltage of the cell plate line from logic low to the intermediate voltage (after the memory cell is written logic high) provides a "pumping" mechanism that increases, or pumps, the voltage in the memory cell (see FIG. 3, identified as Vcell) to a value greater than the logic high voltage. The amount of increased voltage is referred to as pump margin. It will be understood that the pumped voltage stored in the memory provides an increase in the voltage differential on the bit lines during a subsequent read operation of the memory cell.

Similarly, a read operation (reading a logic zero stored in the memory cell) shown in FIG. 4 generally begins at a time T1 when the SHORT ARRAY signal is deactivated (low) resulting in the precharge and equilibration of the bit lines (BLT, BLC) to a voltage Vblp (intermediate voltage). As will be appreciated, the Vblp voltage is also applied to the cell plate line 124 of the active memory cell (shown as Vplate). At a time T2, the word line WL1 is activated turning on the access transistor 110 and coupling the capacitor (or charge-storing device) 112 to the bit line BLT 104. A dummy cell (not shown) is also activated coupling a voltage reference Vref (not shown, and preferably about Vdd/3) to the bit line BLC 102. A differential voltage is generated on the bit lines BLC 102 and BLT 104. At a time T3, the SA signal is activated. The activated sense amplifier 150 amplifies the differential voltage present on the bit lines BLC 102 and BLT 104 generating a logic low voltage on the BLT 104 and a logic high voltage on the BLC 102. Because the reference voltage circuits 130 in the embodiments shown in FIGS. 2A and 2B couple the bit line BLT 104 (inverted) or the bit line BLC 102, respectively, to the cell plate line 124 (Vplate), the voltage applied to the cell plate line 124 (Vplate) is a logic high voltage.

As will be appreciated, the same predetermined delay associated with the voltage driver circuits 130 is present, as described above.

After the word line WL1 is deactivated, and generally after the read operation is completed (or substantially completed), at a time T4, the SHORT ARRAY signal is activated (high) for the next read/write operation, which precharges and equilibrates the bit lines BLC 102 and BLT 104 to voltage Vblp. The voltage driver circuit 130 receives this input voltage and applies the voltage Vblp (intermediate voltage) to the cell plate line 124 (after the predetermined delay). As will be appreciated, decreasing the voltage of the cell plate line from logic high to the intermediate voltage (after the memory cell is written logic low) provides a "pumping" mechanism that decreases, or pumps, the voltage in the memory cell (see FIG. 3, identified as Vcell) to a value less than the logic low voltage. The amount of decreased voltage is referred to as pump margin. It will be understood that the pumped (down) voltage stored in the memory provides a increase in the voltage differential on the bit lines during a subsequent read operation of the memory cell.

It will be understood that all the relevant active circuitry, or operating voltages, should be designed to provide correct operation with a pumped voltage (high or low) stored in the memory cell. This may include ensuring that the pumped down voltage stored in the memory cell is not lower than the back bias voltage minus Vt.

Figure 5:
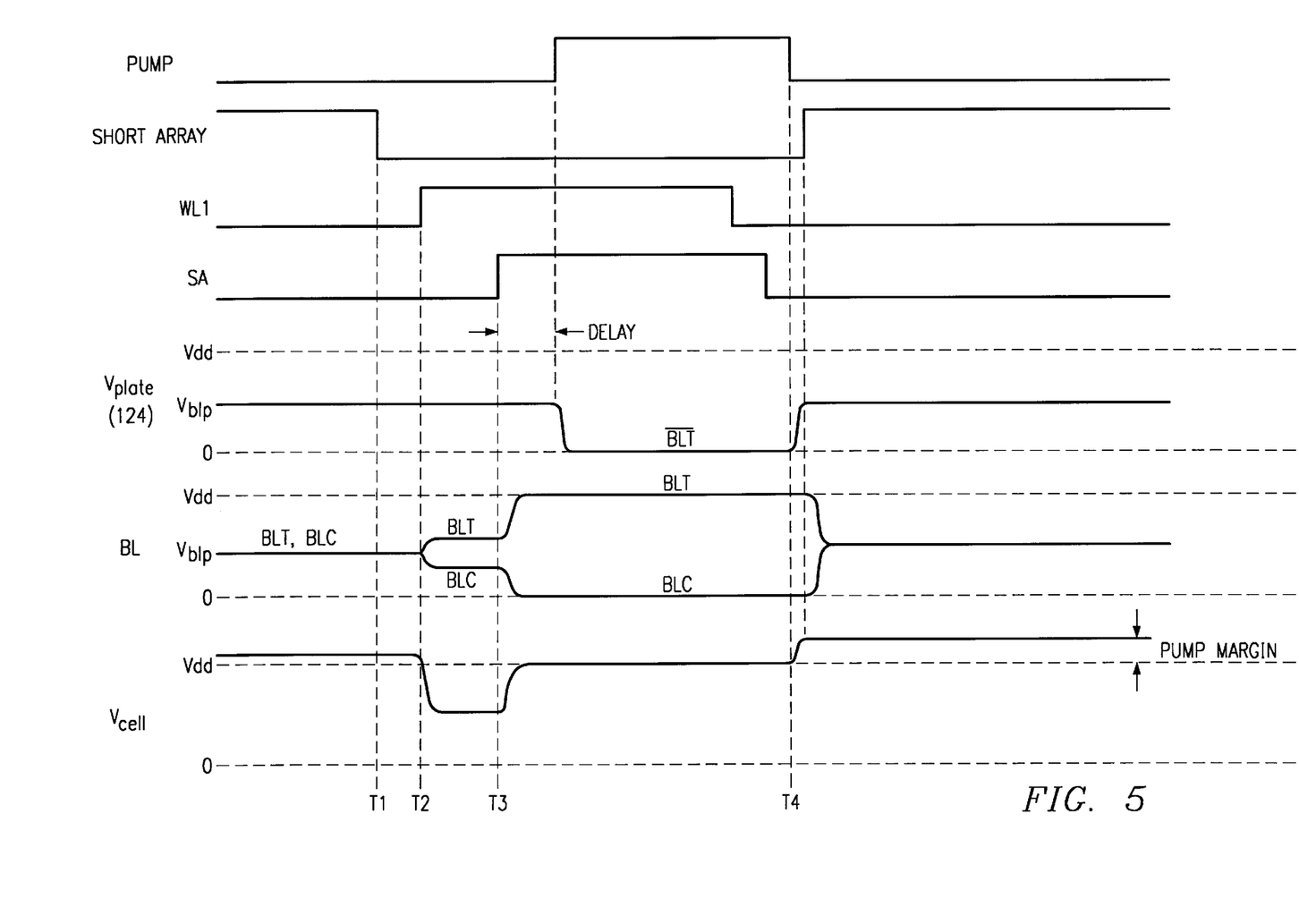
FIG. 5 is a timing diagram illustrating a read operation for a logic one stored in the memory cell for the embodiment shown in FIG. 2C.
Figure 6:
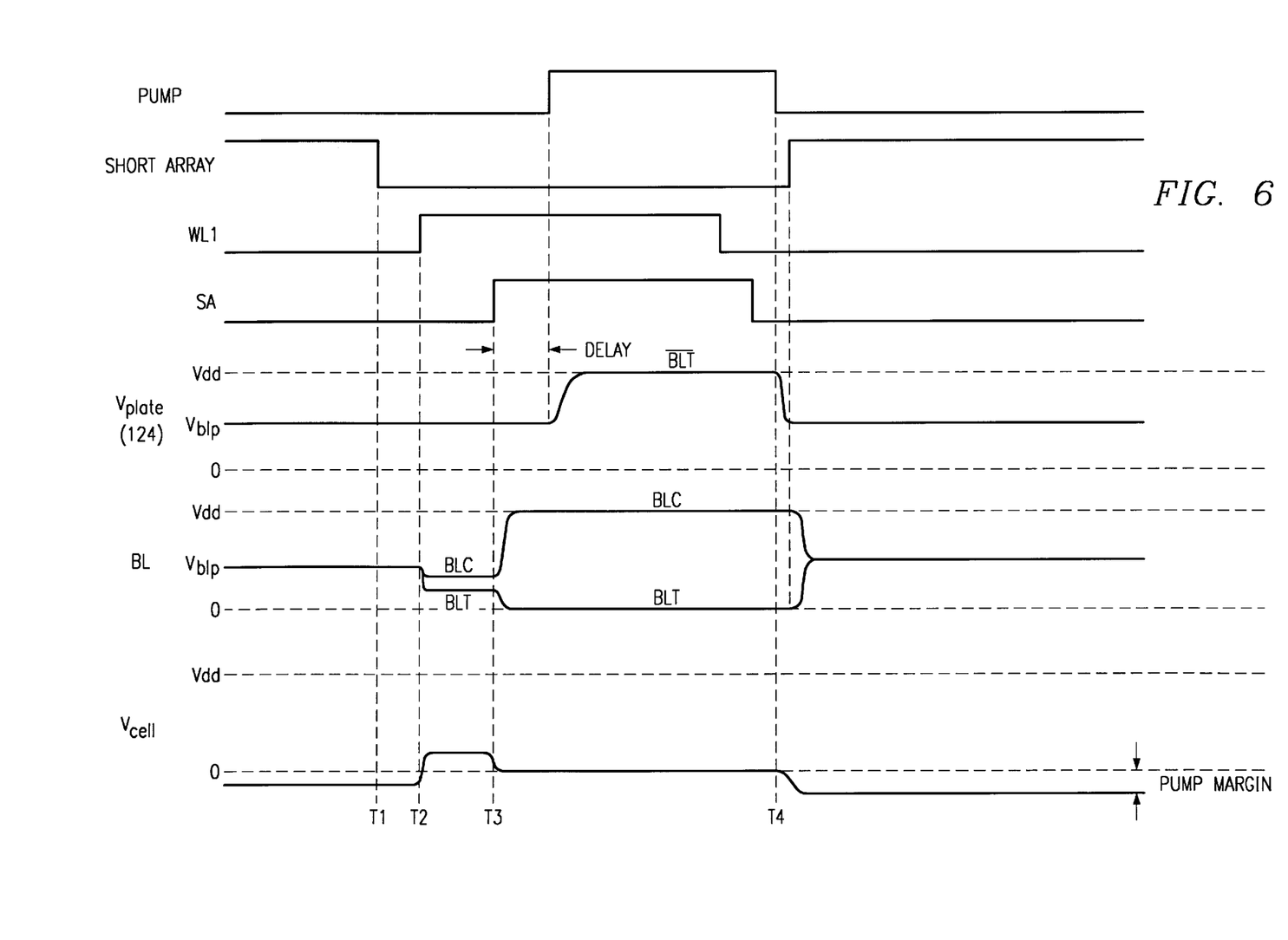
FIG. 6 is a timing diagram illustrating a read operation for a logic zero stored in the memory cell for the embodiment shown in FIG. 2C.

Now referring to FIGS. 5 and 6 (and with reference to FIG. 2C), there are shown detailed timing diagrams illustrating a read operation for a logic one and a logic zero, respectively, stored in the memory cell for the embodiment shown in FIG. 2C.

The read operation (reading a logic one stored in the memory cell) shown in FIG. 5 is similar to the read operation in FIG. 3 until after the activation of the sense amplifier 150 at time T3. After a predetermined delay (sufficient to allow the sense amplifier 150 to sense the bit lines and generate a logic high and logic low on the bit lines), a PUMP signal is activated which applies a logic low to the cell plate line 124. Because the voltage driver circuit 130 in the embodiment shown in FIG. 2C couples the bit line BLT 104 (inverted) to the cell plate line 124 (Vplate), the voltage applied to the cell plate line 124 (Vplate) is a logic low voltage. It will be understood another alternative embodiment (not shown) would include an additional inverter configured in series with the inverter (210,212) with the input coupled to the complement bit line BLC 104 instead of the true bit line BLT 102.

After the word line WL1 is deactivated, and generally after the read operation is completed (or substantially completed), at a time T4, the PUMP signal is deactivated resulting in application of the voltage Vblp (the intermediate voltage) to the cell plate line 124. Increasing the voltage of the cell plate line 124 from logic low to the intermediate voltage (after the memory cell is written logic high) provides the pumping mechanism that increases, or pumps, the voltage in the memory cell (see FIG. 5, identified as Vcell) to a value greater than the logic high voltage, providing the pump margin. The pumped voltage stored in the memory provides an increase in the voltage differential on the bit lines during a subsequent read operation of the memory cell.

As will be appreciated, the additional circuitry shown in FIG. 2C helps reduce power dissipation that would occur with the inverter (210, 212) activated when its input is the voltage Vblp (the intermediate voltage).

Similarly, a read operation (reading a logic zero stored in the memory cell) shown in FIG. 6 is similar to the read operation in FIG. 5. After a predetermined delay the PUMP signal is activated which applies a logic high to the cell plate line 124. Because the voltage driver circuit 130 in the embodiment shown in FIG. 2C couples the bit line BLT 104 (inverted) to the cell plate line 124 (Vplate), the voltage applied to the cell plate line 124 (Vplate) is a logic high voltage.

After the word line WL1 is deactivated, and generally after the read operation is completed (or substantially completed), at a time T4, the PUMP signal is deactivated resulting in application of the voltage Vblp (the intermediate voltage) to the cell plate line 124. Decreasing the voltage of the cell plate line 124 from logic high to the intermediate voltage (after the memory cell is written logic low) provides the pumping mechanism that decreases, or pumps, the voltage in the memory cell (see FIG. 5, identified as Vcell) to a value less than the logic low voltage, providing the pump margin. The pumped voltage stored in the memory provides an increase in the voltage differential on the bit lines during a subsequent read operation of the memory cell.

In general terms, the present invention provides a circuit and method of increasing the stored voltage (greater than a logic one voltage level) in a memory cell by holding the memory cell plate 116 at a logic low during the writing of a logic one to the memory cell, and then raising the voltage at the memory cell plate 116 to an intermediate voltage after the word line is deactivated. Similarly, it decreases the stored voltage (less than a logic zero voltage level) in a memory cell by holding the memory cell plate 116 at a logic high during the writing of a logic zero to the memory cell, and then decreasing the voltage at the memory cell plate 116 to an intermediate voltage after the word line is deactivated. This results in increased differential voltages on the bit lines during a read operation of the memory cell.

Although the present invention and its advantages have been described in the foregoing detailed description and illustrated in the accompanying drawings, it will be understood by those skilled in the art that the invention is not limited to the embodiment(s) disclosed but is capable of numerous rearrangements, substitutions and modifications without departing from the spirit and scope of the invention as defined by the appended claims.

What is claimed is:

1. A memory, comprising:
    a first bit line;
    a charge-storing element having a first plate and a second plate;
    an access device having a first end, a second end and a control terminal, the first end coupled to the first bit line, the second end coupled to the first plate of the charge-storing element and defining a node, and the control terminal coupled to a word line;
    a voltage driver circuit having a first terminal coupled to the second plate of the charge-storing element, and wherein the voltage driver circuit provides, a high logic level voltage to the second plate of the charge-storing element when a low logic level is present on a second bit line, a low logic level voltage to the second plate of the charge-storing element when a high logic level voltage is present on a second bit line, and substantially the same voltage as an intermediate voltage to the second plate of the charge-storing element when the intermediate voltage level is present on the second bit line.

2. The memory in accordance with claim 1 wherein the charge-storing element comprises a capacitor.

3. The memory in accordance with claim 1 wherein the first bit line and the second bit line are the same bit line, and the voltage driver circuit couples the first bit line to the second plate of the charge-storing element.

4. The memory in accordance with claim 3 wherein the voltage driver circuit comprises at least one inverter having a predetermined delay.

5. The memory in accordance with claim 1 wherein the second bit line is the complement bit line of the first bit line, and the voltage driver circuit couples the second bit line to the second plate of the charge-storing element.

6. The memory in accordance with claim 5 wherein the voltage driver circuit comprises a buffer circuit having a predetermined delay.

7. The memory in accordance with claim 6 wherein the buffer circuit comprises at least two inverters.

8. A memory, comprising:
    a first bit line;
    a charge-storing element having a first plate and a second plate;
    an access device having a first end, a second end and a control terminal, the first end coupled to the first bit line, the second end coupled to the first plate of the charge-storing element and defining a node, the control terminal coupled to a word line, the access device for coupling and decoupling the node from the first bit line;

a voltage driver circuit, having a first input terminal and a first terminal coupled to the second plate of the charge-storing element, for applying a first voltage to the second plate of the charge-storing element when the access device is activated and a second voltage is applied to the node, and for applying a third voltage to the second plate after the access device is deactivated.

9. The memory in accordance with claim 8 wherein the charge-storing element comprises a capacitor.

10. The memory in accordance with claim 8 wherein the second voltage is greater than the first voltage and the third voltage is greater than the first voltage, and wherein the voltage stored on the node is pumped to a magnitude greater than the second voltage.

11. The memory in accordance with claim 10 wherein the second voltage is a logic high value, the first voltage is a logic low value, and the third voltage is an intermediate value between the logic high and logic low values.

12. The memory in accordance with claim 8 wherein the second voltage is less than the first voltage and the third voltage is less than the first voltage, and wherein the voltage stored on the node is pumped to a magnitude less than the second voltage.

13. The memory in accordance with claim 8 wherein the input terminal of the voltage driver circuit is connected to the first bit line.

14. The memory in accordance with claim 13 wherein the voltage driver circuit comprises a second input terminal connected to the third voltage.

15. The memory in accordance with claim 14 wherein the voltage driver circuit couples the third voltage to the second plate of the charge-storing device when a pump signal is in a first state and couples the first bit line through a buffer circuit to the second plate of the charge-storing device when the pump signal is in a second state.

16. The memory in accordance with claim 8 wherein the input terminal of the voltage driver circuit is connected to a second bit line which is a complement bit line of the first bit line.

17. The memory in accordance with claim 15 wherein the voltage driver circuit comprise a second input terminal connected to the third voltage.

18. The memory in accordance with claim 17 wherein the voltage driver circuit comprise a third voltage to the second plate of the charge-storing device when a pump signal is in a first state and couples the second bit line through a buffer circuit to the second plate of the charge-storing device when the pump signal is in a second state.

19. A method of pumping a memory, comprising:

activating a word line for coupling a first plate of a memory cell to a first bit line;

activating a sense amplifier coupled to the first bit line and a second bit line for detecting a voltage differential between the first bit line and the second bit line;

applying a high logic voltage value to the first bit line and a low logic voltage value to the second bit line;

applying a first voltage to a second plate of the memory cell;

deactivating the word line for decoupling the first plate of the memory cell from the first bit line; and after the step of deactivating the word line, applying a second voltage to the second plate of the memory wherein the second voltage is greater than the first voltage.

20. The method in accordance with claim 19 wherein the step of applying the first voltage to the second plate of the memory cell comprises coupling the second bit line to the second plate of the memory cell through a voltage driver circuit.

21. The method in accordance with claim 19 wherein the step of applying the first voltage to the second plate of the memory cell comprises coupling the first bit line to the second plate of the memory cell through a voltage driver circuit.

22. A method of pumping a memory, comprising:

precharging and equilibrating a first bit line and a second bit line to an intermediate voltage, the intermediate voltage having a magnitude between a first voltage and a second voltage representing a logic high and a logic low, respectively;

activating a word line for coupling a first plate of a memory cell to the first bit line;

activating a sense amplifier coupled to the first bit line and the second bit line;

applying the first voltage to the first bit line and the second voltage to the second bit line;

applying the second voltage to a second plate of the memory cell;

deactivating the word line for decoupling the first plate of the memory cell from the first bit line; and after the step of deactivating the word line, applying a third voltage to the second plate of the memory wherein the third voltage is substantially equal to the intermediate voltage.

23. The method in accordance with claim 22 wherein the steps of applying the second voltage to the second plate of the memory cell and applying the third voltage to the second plate of the memory cell comprises coupling the second bit line to the second plate of the memory cell through a voltage driver circuit.

24. The method in accordance with claim 22 wherein the steps of applying the second voltage to the second plate of the memory cell and applying the third voltage to the second plate of the memory cell comprises coupling the first bit line to the second plate of the memory cell through a voltage driver circuit.

* * * * *